(12) United States Patent
Kurooka

(10) Patent No.: US 6,608,579 B2
(45) Date of Patent: Aug. 19, 2003

(54) DIGITAL-TO-ANALOG CONVERTING CIRCUIT GIVING LINEAR RELATION BETWEEN DIGITAL CODE AND OSCILLATION FREQUENCY OF OSCILLATOR

(75) Inventor: Kazuaki Kurooka, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/193,318

(22) Filed: Jul. 12, 2002

(65) Prior Publication Data

US 2003/0043063 A1 Mar. 6, 2003

(30) Foreign Application Priority Data

Sep. 5, 2001 (JP) ........................ 2001-269253

(51) Int. Cl.[7] .................................................. H03M 1/66
(52) U.S. Cl. ........................................ 341/144; 341/138
(58) Field of Search ................................ 341/144, 138, 341/154, 140, 147, 153

(56) References Cited

U.S. PATENT DOCUMENTS 5,703,524 A * 12/1997 Chen ........................... 327/560
5,731,774 A *  3/1998 Fujii et al. ................... 341/144
6,310,568 B1 * 10/2001 Kurooka ...................... 341/144

* cited by examiner

*Primary Examiner*—Peguy JeanPierre
(74) *Attorney, Agent, or Firm*—Burns, Doane, Swecker & Mathis, LLP

(57) ABSTRACT

A digital-to-analog converting circuit of the invention includes p-channel FETs 13 to 16 that compose a current mirror circuit together with p-channel FETs 11, 22 to 24 causing a constant current to flow; transmission gates 42 to 44 perform control by which the number of transistors to be turned ON in the p-channel FETs 22 to 24 is decreased around a medium value of digital codes, and the number of transistors to be turned ON in the p-channel FETs 22 to 24 is increased around the minimum value and the maximum value of the digital codes; and switches 17 to 20 that output analog currents according to the digital codes into two-split routes.

8 Claims, 10 Drawing Sheets

| Bit3 | 2 | 1 | 0 | Idac1 | Idac2 | Idac1+Idac2 |
|---|---|---|---|---|---|---|
| 0 | 0 | 0 | 0 | 0.000 µA | 13.158 µA | 13.158 µA |
| 0 | 0 | 0 | 1 | 0.893 | 12.500 | 13.393 |
| 0 | 0 | 1 | 0 | 1.818 | 11.818 | 13.636 |
| 0 | 0 | 1 | 1 | 2.778 | 11.111 | 13.889 |
| 0 | 1 | 0 | 0 | 3.774 | 10.377 | 14.151 |
| 0 | 1 | 0 | 1 | 4.808 | 9.615 | 14.423 |
| 0 | 1 | 1 | 0 | 5.882 | 8.824 | 14.706 |
| 0 | 1 | 1 | 1 | 7.000 | 8.000 | 15.000 |
| 1 | 0 | 0 | 0 | 8.000 | 7.000 | 15.000 |
| 1 | 0 | 0 | 1 | 8.824 | 5.882 | 14.706 |
| 1 | 0 | 1 | 0 | 9.615 | 4.808 | 14.423 |
| 1 | 0 | 1 | 1 | 10.377 | 3.774 | 14.151 |
| 1 | 1 | 0 | 0 | 11.111 | 2.778 | 13.889 |
| 1 | 1 | 0 | 1 | 11.818 | 1.818 | 13.636 |
| 1 | 1 | 1 | 0 | 12.500 | 0.893 | 13.393 |
| 1 | 1 | 1 | 1 | 13.158 | 0.000 | 13.158 |

EMBODIMENT 2

FIG.9(b)

EMBODIMENT 3

| Bit3 | 2 | 1 | 0 | Idac1 | Idac2 |
|---|---|---|---|---|---|
| 0 | 0 | 0 | 0 | 0 μA | 15 μA |
| 0 | 0 | 0 | 1 | 1 | 14 |
| 0 | 0 | 1 | 0 | 2 | 13 |
| 0 | 0 | 1 | 1 | 3 | 12 |
| 0 | 1 | 0 | 0 | 4 | 11 |
| 0 | 1 | 0 | 1 | 5 | 10 |
| 0 | 1 | 1 | 0 | 6 | 9 |
| 0 | 1 | 1 | 1 | 7 | 8 |
| 1 | 0 | 0 | 0 | 8 | 7 |
| 1 | 0 | 0 | 1 | 9 | 6 |
| 1 | 0 | 1 | 0 | 10 | 5 |
| 1 | 0 | 1 | 1 | 11 | 4 |
| 1 | 1 | 0 | 0 | 12 | 3 |
| 1 | 1 | 0 | 1 | 13 | 2 |
| 1 | 1 | 1 | 0 | 14 | 1 |
| 1 | 1 | 1 | 1 | 15 | 0 |

DIGITAL-TO-ANALOG CONVERTING CIRCUIT GIVING LINEAR RELATION BETWEEN DIGITAL CODE AND OSCILLATION FREQUENCY OF OSCILLATOR

BACKGROUND OF THE INVENTION

1. Field of the Invention

The present invention relates to a DAC circuit (Digital-to-Analog converting circuit).

2. Description of Related Art

Figure 12:
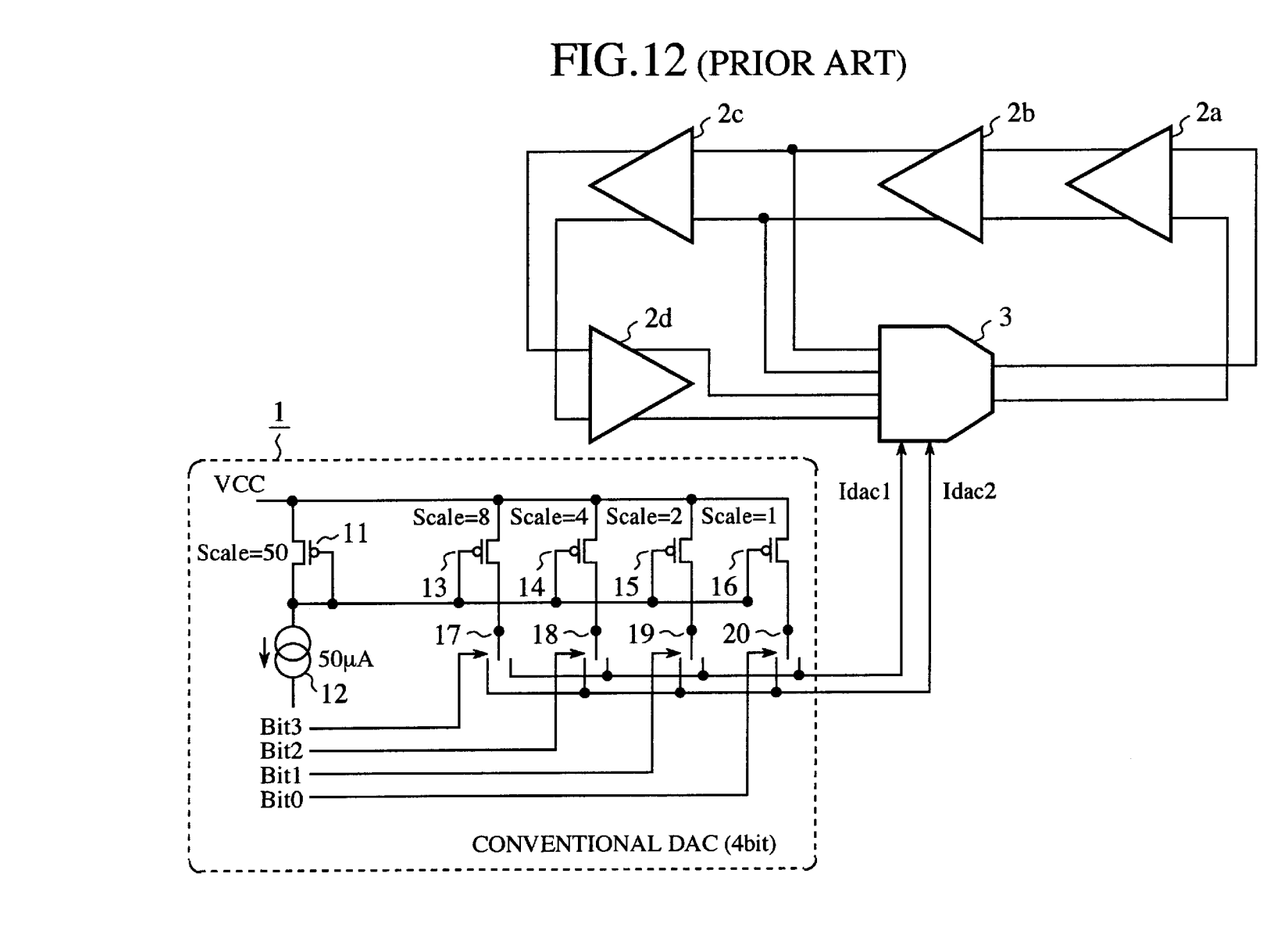
FIG. 12 is a circuit diagram to illustrate a ring oscillator using a conventional DAC circuit.

FIG. 12 is a circuit diagram of a ring oscillator using a conventional DAC circuit, and in the figure, reference numeral 1 signifies the DAC circuit that outputs analog currents Idac 1 and Idac 2 according to digital codes into two split routes.

Reference numerals 2a to 2d signify a differential amplifier connected in a ring, and 3 signifies a composite circuit composed of two differential amplifiers, which outputs a signal voltage obtained by adjusting the ratio of a signal voltage from the differential amplifier 2b to a signal voltage from the differential amplifier 2d in accordance with the analog currents Idac 1 and Idac 2 and thereafter adding the outputs of the above two differential amplifiers. The differential amplifiers 2a, 2b, and one of the differential amplifiers inside the composite circuit 3 constitute a three-stage ring oscillator; and the differential amplifiers 2a to 2d and the another differential amplifier inside the composite circuit 3 constitute a five-stage ring oscillator.

In addition, in the DAC circuit 1, reference numeral 11 denotes a p-channel FET having a source connected to a power supply VCC and having a drain connected to a constant current source 12, 13 to 16 each denote the p-channel FET having each source connected to the power supply VCC and having each gate connected commonly to a gate of the p-channel FET 11, and each p-channel FET constitutes a current mirror circuit together with the p-channel FET 11. These p-channel FETs 13 to 16 are provided in correspondence with each bit of input digital codes. For example, when the input digital codes are 4 bits in total, namely, from bit 0 to bit 3, the DAC circuit 1 includes four p-channel FETs 13 to 16, as shown in FIG. 12. Further, with regard to the p-channel FETs 13 to 16, the transistor number (transistor size) is produced in correspondence with the corresponding bit thereof. For example, if the transistor number of the p-channel FET 16 corresponding to bit 0 is assumed to be Scale=1, the transistor number of the p-channel FET 15 corresponding to bit 1 is produced in Scale=2, the transistor number of the p-channel FET 14 corresponding to bit 2 is produced in Scale=4, and the transistor number of the p-channel FET 13 corresponding to bit 3 is produced in Scale=8, and further the transistor number of the p-channel FET 11 of the current mirror circuit source is produced in Scale=50.

Reference numerals 17 to 20 each denote a switch that switches the analog current from the corresponding drain of the p-channel FETs 13 to 16 in correspondence with the input digital code between two routes of analog currents Idac 1 and Idac 2, which are supplied to the composite circuit 3.

Figure 13:
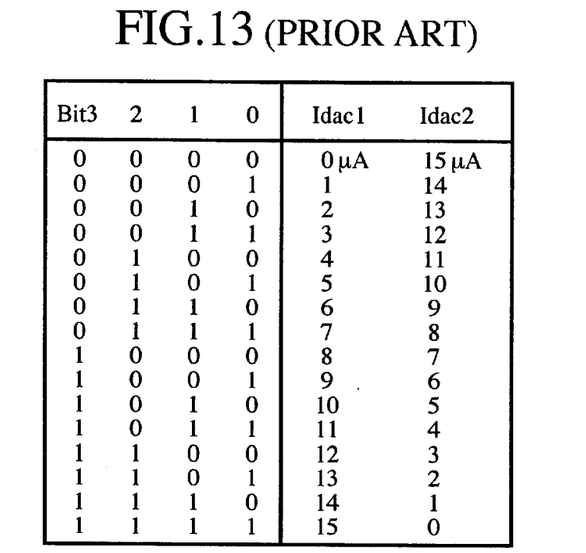
FIG. 13 is a table to illustrate the relation between digital codes and analog currents Idac 1, Idac 2 of the conventional DAC circuit.

FIG. 13 is a table chart of the relation between the digital codes and the analog currents Idac 1, Idac 2 of the conventional DAC circuit.

Figure 14:
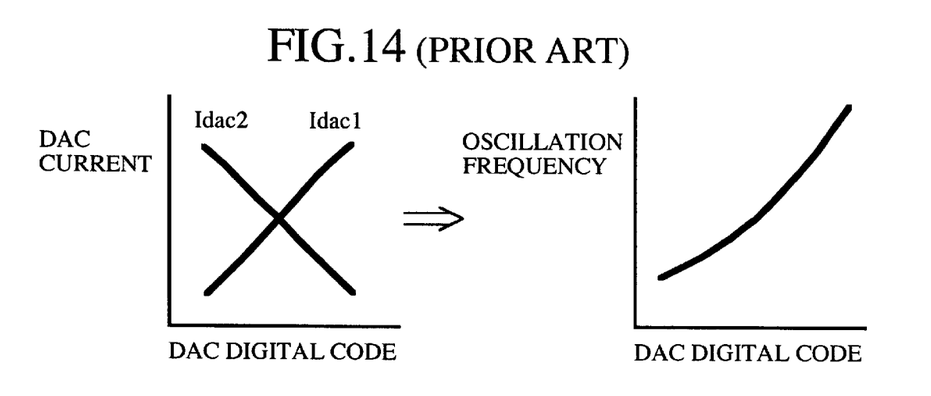
FIG. 14 are characteristic charts to illustrate the relation between the digital codes and the analog currents Idac 1, Idac 2 of the conventional DAC circuit, and the relation between the digital codes and the oscillation frequency of the ring oscillator using the DAC circuit of the same.

FIG. 14 includes a characteristic chart of the relation between the digital codes and the analog currents Idac 1, Idac 2 of the conventional DAC circuit, and a characteristic chart of the relation between the digital codes and the oscillation frequency of the ring oscillator using the DAC circuit of the same.

Figure 15:
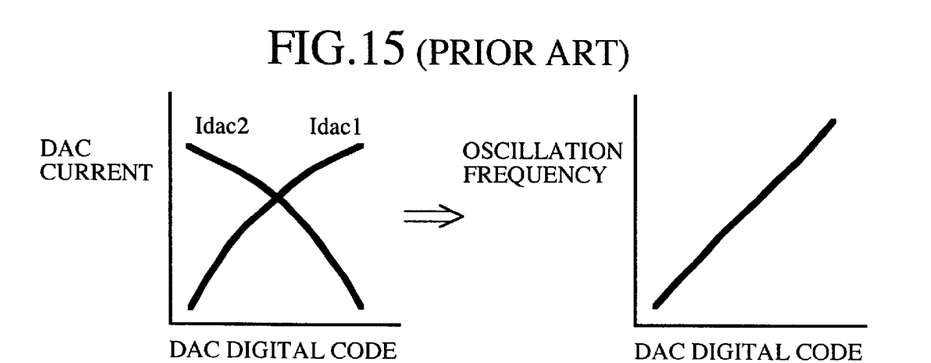
FIG. 15 are characteristic charts to illustrate the relation between the digital codes and the analog currents Idac 1, Idac 2 of an ideal DAC circuit, and the relation between the digital codes and the oscillation frequency of the ring oscillator using the DAC circuit of the same.

FIG. 15 includes a characteristic chart of the relation between the digital codes and the analog currents Idac 1, Idac 2 of an ideal DAC circuit, and a characteristic chart of the relation between the digital codes and the oscillation frequency of the ring oscillator using the DAC circuit of the same.

Next, the operation will be explained.

In the DAC circuit 1, the p-channel FET 11 of the current mirror circuit source connected to the constant current source 12 has the transistor number produced in Scale=50, 50 $\mu$A constantly flowing through the p-channel FET 11.

In the p-channel FETs 13 to 16 connected in the current mirror connection configuration with the p-channel FET 11, a constant current according to each transistor number flows through the corresponding transistor. That is, the transistor number of the p-channel FET 13 is Scale=8, 8 $\mu$A constantly flowing through the p-channel FET 13; the transistor number of the p-channel FET 14 is Scale=4, 4 $\mu$A constantly flowing through the p-channel FET 14; the transistor number of the p-channel FET 15 is Scale=2, 2 $\mu$A constantly flowing through the p-channel FET 15; and the transistor number of the p-channel FET 16 is Scale=1, 1 $\mu$A constantly flowing through the p-channel FET 16.

The switches 17 to 20 switch the analog currents from the drains of the p-channel FETs 13 to 16, respectively, in correspondence with the input digital codes. For example, if the digital code is "0", the side of the analog current Idac 2 will be selected; if the digital code is "1", the side of the analog current Idac 1 will be selected.

FIG. 13 illustrates the relation between the digital codes and the analog currents Idac 1, Idac 2 in that case. Thus, the analog currents Idac 1, Idac 2 produced by the DAC circuit 1 varies uniformly in accordance with the digital codes, and variations in the analog currents Idac 1, Idac 2 for the 1 LSB of the digital codes is constant relative to all the values of the digital codes.

In the ring oscillator, the differential amplifiers 2a, 2b, and one of the differential amplifiers inside the composite circuit 3 constitute the three-stage ring oscillator that generates higher frequencies; and the differential amplifiers 2a to 2d and the other inside the composite circuit 3 constitute the five-stage ring oscillator that generates lower frequencies.

The composite circuit 3 adjusts the ratio of a signal voltage from the differential amplifier 2b to a signal voltage from the differential amplifier 2d in accordance with the analog currents Idac 1 and Idac 2 supplied from the DAC circuit 1, thereafter adds the outputs of the above two differential amplifiers, and outputs the result as a signal voltage. For instance, if the analog current Idac 1 is 0 $\mu$A and the analog current Idac 2 is 15 $\mu$A, the composite circuit 3 will output a signal voltage acquired by decreasing the weighting of the signal voltage from the differential amplifier 2b and increasing the weighting of the signal voltage from the differential amplifier 2d and then adding both the results; and if the analog current Idac 1 is 15 $\mu$A and the analog current Idac 2 is 0 $\mu$A, the composite circuit 3 will output a signal voltage acquired by increasing the weighting of the signal voltage from the differential amplifier 2b and decreasing the weighting of the signal voltage from the differential amplifier 2d and then adding both the results.

The left characteristic chart in FIG. 14 illustrates the relation between the digital codes and the analog currents Idac 1, Idac 2 of the DAC circuit 1 illustrated in FIG. 12, which is a graphic expression of the table illustrated in FIG. 13. The right characteristic chart in FIG. 14 illustrates the relation between the digital codes input to the DAC circuit 1 and the oscillation frequency output from the composite circuit 3, when the ring oscillator is controlled using the analog currents Idac 1, Idac 2 according to the digital codes.

Since the conventional DAC circuit is configured as above, the analog currents Idac 1, Idac 2 produced by the DAC circuit 1 varies uniformly in accordance with the digital codes, and the variations in the analog currents Idac 1, Idac 2 for the 1 LSB of the digital codes is constant relative to all the values of the digital codes.

However, when the oscillation frequency of the ring oscillator is controlled using the analog currents Idac 1, Idac 2, the oscillation frequency of the ring oscillator does not vary constantly relative to the variations in the analog currents Idac 1, Idac 2; and as illustrated in the right characteristic chart in FIG. 14, the variations in the oscillation frequency are decreased on the side of the smaller digital codes, and the variations in the oscillation frequency are increased on the side of the greater digital codes. In consequence, the controllability is not stabilized.

Therefore, there has been a requirement for a DAC circuit having the characteristics such that the relations between the digital codes and the analog currents Idac 1, Idac 2 are swollen upward in a convex form, as illustrated in the left characteristic chart in FIG. 15, and the relation between the digital codes and the oscillation frequency varies constantly, as illustrated in the right characteristic chart in FIG. 15.

SUMMARY OF THE INVENTION

In view of the foregoing, the present invention has been made, and an object of the invention is to provide a DAC circuit that outputs more analog currents around a medium value of the digital codes as compared with a conventional DAC circuit.

According to one aspect of the invention, a digital-to-analog converting circuit including: a first transistor group composed of a plurality of transistors, which causes a constant current to flow through the plurality of transistors; a second transistor group composed of a plurality of transistors corresponding to each bit of digital codes, and composing a current mirror circuit together with the first transistor group; and a control circuit that perform a control by which a number of transistors to be turned ON in the first transistor group is decreased around a medium value of the digital codes input, and the number of transistors to be turned ON in the first transistor group is increased around the minimum value and the maximum value of the digital codes, and the second transistor group outputs analog currents according to the digital codes into two split routes.

According to another aspect of the invention, a digital-to-analog converting circuit including: a first transistor group composed of a plurality of transistors, which causes a constant current to flow through the plurality of transistors; a second transistor group composed of a plurality of transistors, which causes a constant current to flow through the plurality of transistors; a third transistor group composed of a plurality of transistors corresponding to each bit of digital codes, and composing a current mirror circuit together with the first transistor group, in which the transistors corresponding to each bit of the input digital codes operate in accordance with the input digital codes so as to output an analog current in accordance with the digital codes; a fourth transistor group composed of a plurality of transistors corresponding to each bit of digital codes, and composing a current mirror circuit together with the second transistor group, in which the transistors corresponding to each bit of the input digital codes operate in accordance with the input digital codes in a manner reverse to the third transistor group to output an analog current in accordance with the digital codes; and a control circuit that performs control by which the number of transistors to be turned ON in the first transistor group is increased and to increase the number of transistors to be turned OFF in the second transistor group is increased, while the input digital codes are increased from the minimum value to the maximum value.

By these arrangement these DAC circuit outputs more analog currents than a conventional DAC circuit around the medium value of the digital codes, and if the analog current outputs that are split into two routes are supplied to a ring oscillator from this DAC circuit, it is possible to make the variations in the finally obtained oscillation frequency relative to the digital codes linear.

According to further aspect of the present invention a digital-to-analog converting circuit is characterized by that the first transistor group is composed of a plurality of transistors corresponding to only a plurality of upper bits except for the most significant bit of the digital codes, and the control circuit controls the operation of the plurality of transistors in the first transistor group on the basis of the most significant bit of the input digital codes and the plurality of upper bits.

According to more further aspect of the present invention a digital-to-analog converting circuit is characterized by that first transistor group and the second transistor group are respectively composed of a plurality of transistors corresponding to only a plurality of upper bits of the digital codes, and the control circuit controls the operation of the plurality of transistors in the first and second transistor groups on the basis of the plurality of upper bits of the input digital codes.

By these arrangement deleting the transistors corresponding to the lower bits of the first and/or second transistor groups will lead to an effect of reducing a layout size as well as a chip size.

DETAILED DESCRIPTION OF THE PREFERRED EMBODIMENTS

Preferred embodiments of the invention will be described with reference to the accompanying drawings.
Embodiment 1

Figure 1:
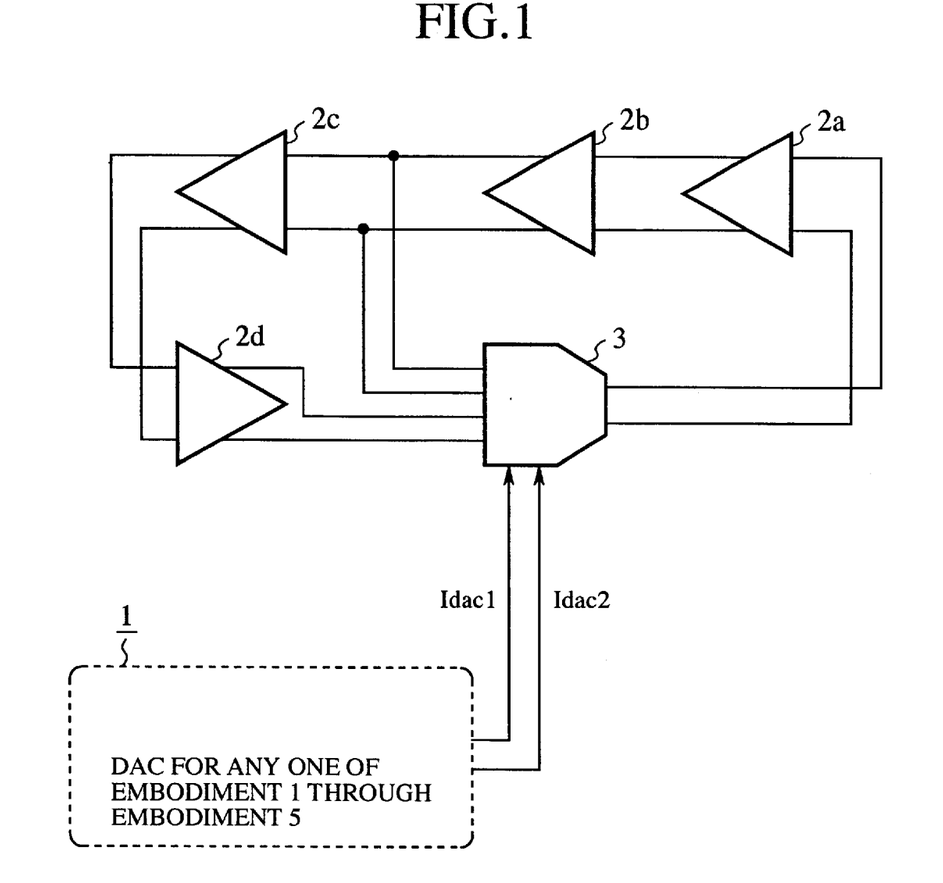
FIG. 1 is a circuit diagram to illustrate a ring oscillator using a DAC circuit according to Embodiment 1 of the present invention.

FIG. 1 is a circuit diagram to illustrate a ring oscillator using a DAC circuit according to Embodiment 1. In the figure, reference numeral 1 signifies the DAC circuit that outputs analog currents Idac 1 and Idac 2 according to digital codes into two split routes.

Reference numerals 2a to 2d respectively signify a differential amplifier, these amplifiers 2a to 2d being connected to each other in a ring, 3 signifies a composite circuit composed of two differential amplifiers, which outputs a signal voltage obtained by adjusting the ratio of signal voltages from the differential amplifier 2b to a signal voltage from the differential amplifier 2d in accordance with the analog currents Idac 1 and Idac 2 and thereafter adding the outputs of the above two differential amplifiers. The differential amplifiers 2a, 2b, and one of the differential amplifiers inside the composite circuit 3 constitute a three-stage ring oscillator; and the differential amplifiers 2a to 2d and the other inside the composite circuit 3 constitute a five-stage ring oscillator.

Figure 2:
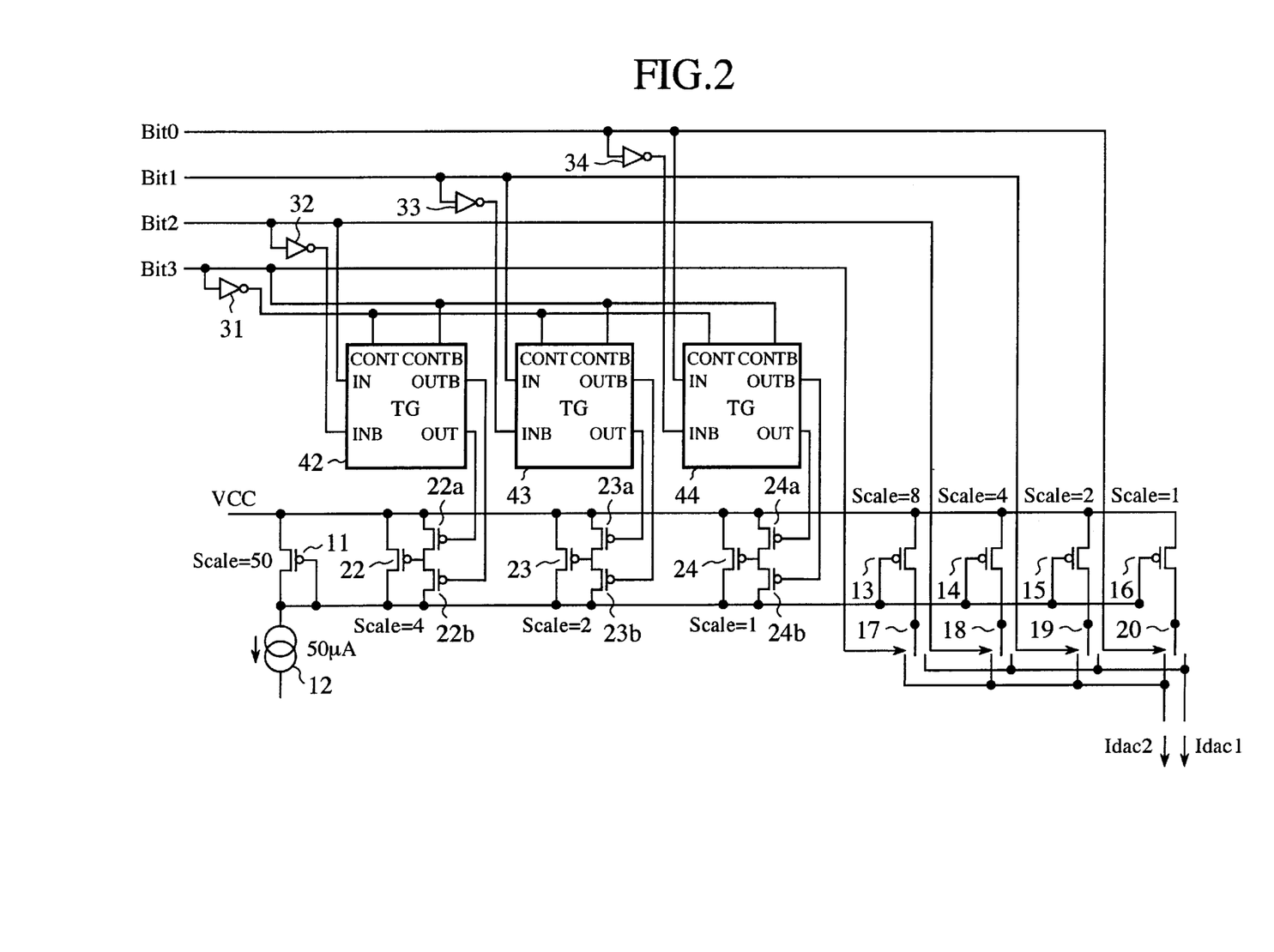
FIG. 2 is a circuit diagram to illustrate a DAC circuit according to Embodiment 1 of the invention.

FIG. 2 illustrates a circuit diagram to illustrate the DAC circuit according to Embodiment 1. In the figure, reference numeral 11 denotes a p-channel FET having a source connected to a power supply VCC and having a drain connected to a constant current source 12, of which transistor number is produced in Scale=50. Reference numerals 22 to 24 denote the p-channel FET having each source connected to the power supply VCC and having each drain connected to the constant current source 12. These p-channel FETs 22 to 24 are provided in correspondence with each bit except for the most significant bit of input digital codes. For example, when the input digital codes are 4 bits in total, namely, from bit 0 to bit 3, the DAC circuit 1 includes three p-channel FETs 22 to 24 in correspondence with bit 2, bit 1, bit 0, respectively. Further, the p-channel FETs 22 to 24 has the transistor number produced in correspondence with the corresponding bit thereof. For example, if the transistor number of the p-channel FET 24 corresponding to bit 0 is assumed to be Scale=1, the transistor number of the p-channel FET 23 corresponding to bit 1 is produced in Scale=2, and the transistor number of the p-channel FET 22 corresponding to bit 2 is produced in Scale=4.

Here, the p-channel FET 11 and the p-channel FETs 22 to 24 constitute a first transistor group.

Reference numerals 22a and 22b, 23a and 23b, 24a and 24b each denote paired p-channel FETs connected to in series, and the sources of p-channel FETs 22a, 23a, 24a are connected to the power supply VCC, and the drains of p-channel FETs 22b, 23b, 24b are connected to the constant current source 12, the nodes of these paired p-channel FETS are each connected to each of the gates of the p-channel FETs 22 to 24.

Reference numerals 13 to 16 each denote a p-channel FET having a source connected to the power supply VCC and a gate connected commonly to a gate of the p-channel FET 11, and each p-channel FET constitutes a current mirror circuit together with the p-channel FET 11. These p-channel FETs 13 to 16 are provided in correspondence with each bit of input digital codes. For example, when the input digital codes are 4 bits in total, namely, from bit 0 to bit 3, the DAC circuit 1 includes four p-channel FETs 13 to 16. Further, the p-channel FETs 13 to 16 each have the transistor number produced in correspondence with the corresponding bit thereof. For example, if the transistor number of the p-channel FET 16 corresponding to bit 0 is assumed to be Scale=1, the transistor number of the p-channel FET 15 corresponding to bit 1 is designed in Scale=2, the transistor number of the p-channel FET 14 corresponding to bit 2 is designed in Scale=4, and the transistor number of the p-channel FET 13 corresponding to bit 3 is designed in Scale=8.

Here, the p-channel FETs 13 to 16 constitute a second transistor group.

Reference numerals 17 to 20 each denote a switch that switches the analog current from the corresponding drain of the p-channel FETs 13 to 16 in correspondence with the input digital code between two routes of analog currents Idac 1 and Idac 2, which are supplied to the composite circuit 3.

Reference numerals 31 to 34 denote an inverter connected to respective bit lines.

Reference numerals 42 to 44 denote a transmission gate (hereunder, referred to as TG) provided in correspondence with each of the series connected p-channel FETs 22a and 22b, 23a and 23b, 24a and 24b. These TGs 42 to 44 each control the respective values of bit 2 to bit 0 and the respective value of bit 2 to bit 0 that are inverted by inverters 32 to 34, in accordance with the value of bit 3 of the digital codes and the value of bit 3 inverted by the inverter 31, respectively, and supply the resultant values to the corresponding gates of the p-channel FETs 22a and 22b, 23a and 23b, 24a and 24b.

Figure 3:
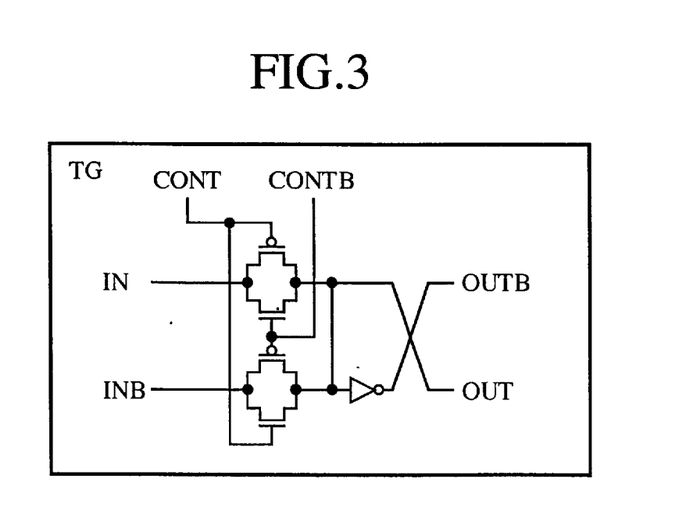
FIG. 3 is a detailed circuit diagram to illustrate a transmission gate according to Embodiment 1 of the invention.

FIG. 3 illustrates a detailed circuit of the transmission gate according to Embodiment 1.

Here, the p-channel FETs 22a and 22b, 23a and 23b, 24a and 24b, the inverters 32 to 34, and TGs 42 to 44 constitute a control circuit.

Figure 4:
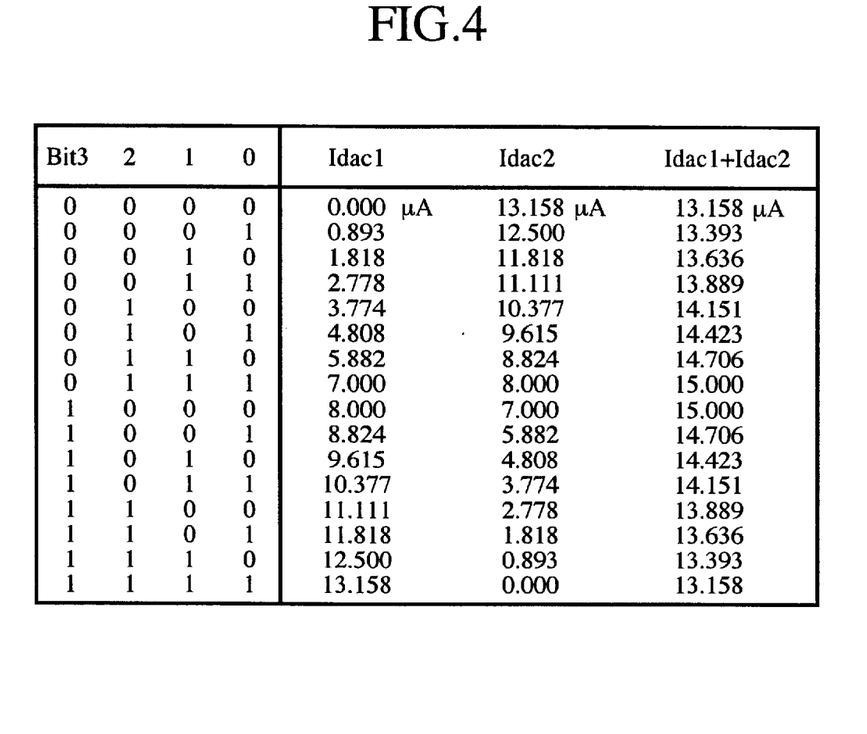
FIG. 4 is a table to illustrate the relation between digital codes and analog currents Idac 1, Idac 2, Idac 1+Idac 2 of the DAC circuit according to Embodiment 1 of the invention.

FIG. 4 illustrates the relation between the digital codes and the analog currents Idac 1, Idac 2, Idac 1+Idac 2 of the DAC circuit according to Embodiment 1.

Figure 5:
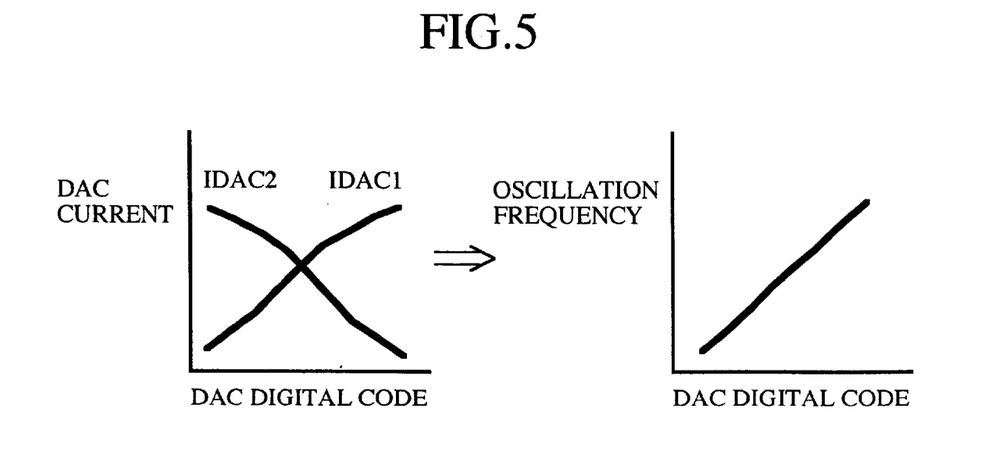
FIG. 5 are characteristic charts to illustrate a relation between the digital codes and the analog currents Idac 1, Idac 2 of the DAC circuit according to Embodiment 1 of the invention, and a relation between the digital codes and an oscillation frequency of the ring oscillator using the DAC circuit of the same.

FIG. 5 is a characteristic chart to illustrate the relation between the digital codes and the analog currents Idac 1, Idac 2 of the DAC circuit according to Embodiment 1, and the relation between the digital codes and the oscillation frequency of the ring oscillator using the DAC circuit of the same.

Next, the operation will be explained.

In the DAC circuit 1 illustrated in FIG. 2, the transistor number of the current mirror sources, p-channel FETs 11, 22 to 24, which are connected to the constant current source 12, is Scale=50, Scale=4, Scale=2, Scale=1, respectively, and 50 $\mu$A in total flow through them constantly.

TGs 42 to 44 control the ON/OFF operation of the corresponding p-channel FETs 22 to 24 in accordance with the value of bit 3 and the value of the corresponding bit of the digital codes.

Each of TGs 42 to 44 is configured as shown in FIG. 3. For example, if the value of bit 3 is "0" and that of bit 0 is "0", CONT becomes "1", CONTB becomes "0", IN becomes "0", INB becomes "1", and OUT "1" is supplied to the gate of the p-channel FET 24a, OUTB "0" is supplied to the gate of the p-channel FET 24b. As a result, the p-channel FET 24a turns OFF and the p-channel FET 24b turns ON, and the p-channel FET 24 turns ON. In the same manner, if the value of bit 1 is "0", the p-channel FET 23 turns ON, and if the value of bit2 is "0", the p-channel FET 22 turns ON.

Further, if the value of bit 3 is "0" and the values of bit0, bit1, bit 2 are "1", the p-channel FET 24, the p-channel FET 23, and the p-channel FET 22 turn OFF.

Conversely, if the value of bit 3 is "1" and the values of bit0, bit1, bit 2 are "0", the p-channel FET 24, the p-channel FET 23, and the p-channel FET 22 turn OFF; and if the value of bit 3 is "1" and the values of bit0, bit1, bit 2 are "1", the p-channel FET 24, the p-channel FET 23, and the p-channel FET 22 turn ON.

In other words, as shown by the table in FIG. 4, all the p-channel FETs 22 to 24 turn ON at the minimum value (0000) and the maximum vale (1111) of the input digital codes, and all the p-channel FETs 22 to 24 turn OFF at the medium values (0111, 1000) of the input digital codes. More in detail, as the digital code approaches the medium value from the minimum value and the maximum value, the number of the transistors that turn ON decreases gradually, and as the digital code approaches the minimum value and the maximum value from the medium value, the number of the transistors that turn ON increases gradually.

In this manner, the p-channel FET 11 and FETs 22 to 24 are controlled such that the total current 50 $\mu$A flow constantly through them, and the number of the transistors that turn ON as the digital code approaches the medium value decreases.

Therefore, in the p-channel FETs 13 to 16 connected in the current mirror configuration with the p-channel FET 11, FETs 22 to 24, the total sum of the analog currents increases as the digital code approaches the medium value and decreases as the digital code approaches the minimum value and maximum value.

The transistor number of the p-channel FETs 13 to 16 is Scale=8, 4, 2, 1, respectively, and the analog current according to each transistor number flows.

The switches 17 to 20 switch the analog currents from the drains of the p-channel FETs 13 to 16 in correspondence with the input digital codes. For example, if the digital code is "0", the route of the analog current Idac 2 is selected, and if the digital code is "1", the route of the analog current Idac 1 is selected.

FIG. 4 illustrates the relation between the digital codes and the analog currents Idac 1, Idac 2, Idac 1+Idac 2, in this case. In this manner, the total sum of the analog currents Idac 1+Idac 2 the DAC circuit 1 produces increases as the digital code approaches the medium value, and decreases as it approaches the minimum value and maximum value.

The differential amplifiers 2a, 2b, and one of the differential amplifiers inside the composite circuit 3 constitute the three-stage ring oscillator that generates higher frequencies; and the differential amplifiers 2a to 2d and the other inside the composite circuit 3 constitute the five-stage ring oscillator that generates lower frequencies.

The composite circuit 3 adjusts the ratio of a signal voltage from the differential amplifier 2b to a signal voltage from the differential amplifier 2d in accordance with the analog currents Idac 1 and Idac 2 supplied from the DAC circuit 1, thereafter adds the outputs of the above two differential amplifiers, and outputs the resultant signal voltage. For instance, if the analog current Idac 1 is 0 $\mu$A and the analog current Idac 2 is 13.158 $\mu$A, the composite circuit 3 will output a signal voltage acquired by decreasing the weighting of the signal voltage from the differential amplifier 2b and increasing the weighting of the signal voltage from the differential amplifier 2d and then adding both the results; and if the analog current Idac 1 is 13.158 $\mu$A and the analog current Idac 2 is 0 $\mu$A, the composite circuit 3 will output a signal voltage acquired by increasing the weighting of the signal voltage from the differential amplifier 2b and decreasing the weighting of the signal voltage from the differential amplifier 2d and then adding both the results.

The left characteristic chart in FIG. 5 illustrates the relation between the digital codes and the analog currents Idac 1, Idac 2 of the DAC circuit 1 illustrated in FIG. 2, which is a graphic expression of the table illustrated in FIG. 4. In addition, the right characteristic chart in FIG. 5 illustrates the relation between the digital codes input to the DAC circuit 1 and the oscillation frequency output from the composite circuit 3, when the ring oscillator is controlled using the analog currents Idac 1, Idac 2 according to the digital codes.

According to Embodiment 1 as described above, since the total sum of the analog currents Idac 1+Idac 2 increases toward the medium value of the digital codes, and decreases toward the minimum value and maximum value of the digital codes, supplying the analog currents Idac 1, Idac 2 from this DAC circuit 1 to the ring oscillator will make the variations in the finally obtained oscillation frequency relative to the digital codes linear.

Embodiment 2

Figure 6:
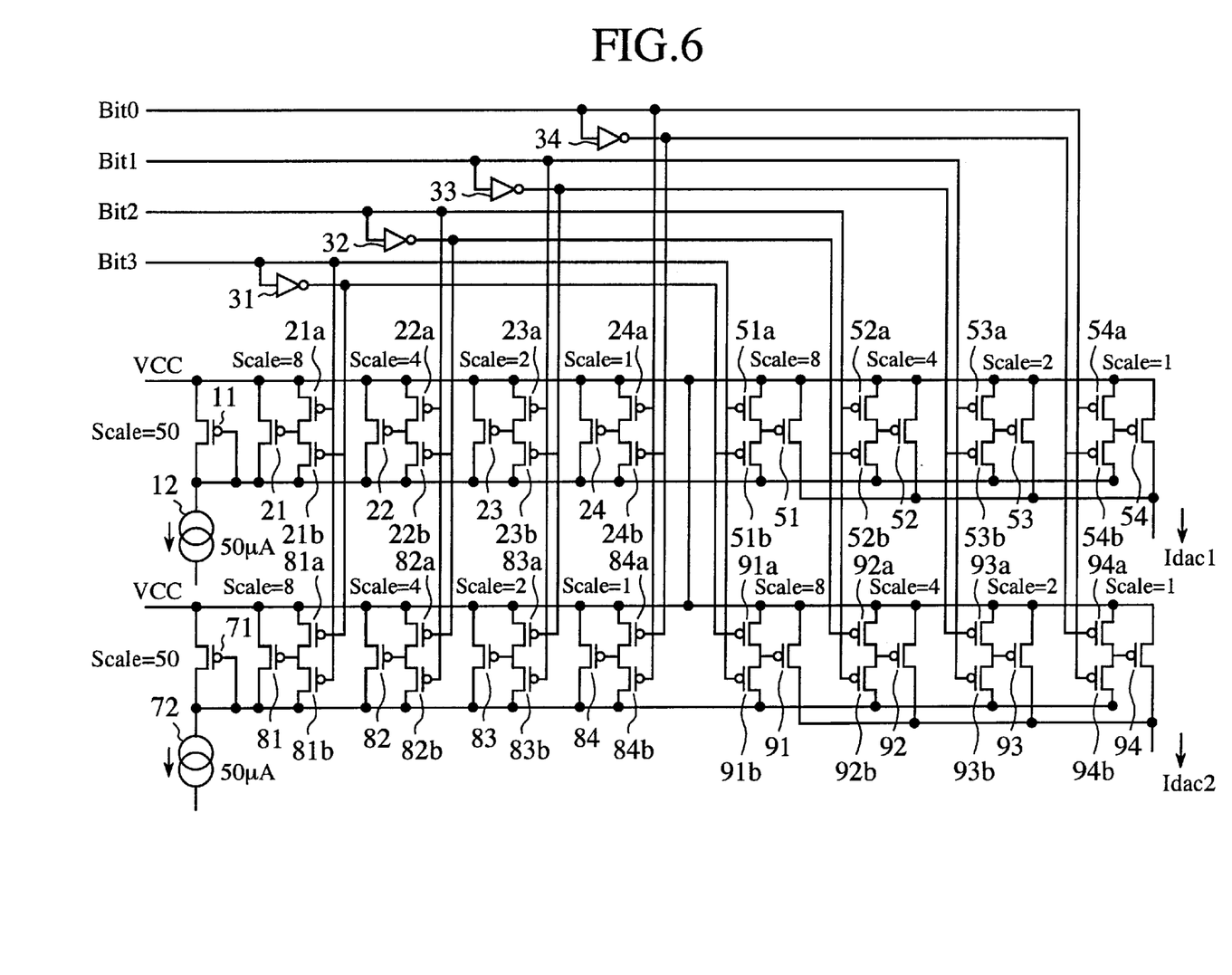
FIG. 6 is a circuit diagram to illustrate a DAC circuit according to Embodiment 2 of the invention.

FIG. 6 illustrates a circuit diagram to illustrate the DAC circuit according to Embodiment 2. In the figure, reference numeral 21 denotes a p-channel FET having a source connected to a power supply VCC and a drain connected to a constant current source 12. The p-channel FET 21 is provided in correspondence with the most significant bit of the digital codes input, and the transistor number thereof is produced in Scale=8.

Here, a p-channel FET 11 and p-channel FETs 21 to 24 constitute a first transistor group.

Also, p-channel FETs 71, 81 to 84, 81a, 81b to 84a, 84b are configured in the same manner as the p-channel FETs 11, 21 to 24, 21a, 21b to 24a, 24b.

The p-channel FET 71 and the p-channel FETs 81 to 84 constitute a second transistor group.

Further, reference numerals 51 to 54 each denote a p-channel FET having a source connected to the power supply VCC and a drain connected to an output route of analog current Idac 1, and the p-channel FET constitutes a current mirror circuit together with the p-channel FET 11. These p-channel FETs 51 to 54 are provided in correspondence with each bit of the input digital codes, and the transistor number of the p-channel FETs 51 to 54 is designed in Scale=8, 4, 2, 1, respectively. 51a and 51b, 52a and 52b, 53a and 53b, 54a and 54b each denote paired p-channel FETs connected in series, the sources of p-channel FETs 51a, 52a, 53a, 54a are connected to the power supply VCC, and the drains of p-channel FETs 51b, 52b, 53b, 54b are connected to the constant current source 12, and the nodes of these paired p-channel FETs are each connected to each of the gates of the p-channel FETs 51 to 54.

The p-channel FETs 51 to 54, 51a, 51b to 54a, 54b constitute a third transistor group.

Further, reference numerals 91 to 94 each denote a p-channel FET having a source connected to the power supply VCC and a drain connected to an output route of analog current Idac 2, and the p-channel FET constitutes a current mirror circuit together with the p-channel FET 71. These p-channel FETs 91 to 94 are provided in correspondence with each bit of the input digital codes, and the transistor number of the p-channel FETs 91 to 94 is designed in Scale=8, 4, 2, 1, respectively. 91a and 91b, 92a and 92b, 93a and 93b, 94a and 94b each denote paired p-channel FETs connected in series, and sources of p-channel FETs 91a, 92a, 93a, 94a are connected to the power supply VCC, drains of p-channel FETs 91b, 92b, 93b, 94b are connected to the constant current source 72, and nodes of these paired p-channel FETs are each connected to each of gates of the p-channel FETs 91 to 94.

The p-channel FETs 91 to 94, 91a, 91b to 94a, 94b constitute a fourth transistor group.

The bit lines of bit 3 to bit 0 are respectively connected to the gates of the p-channel FETs 21a to 24a, p-channel FETs 51a to 54a, p-channel FETs 81b to 84b, p-channel FETs 91b to 94b, and further connected through the inverters 31 to 34 to the gates of the p-channel FETs 21b to 24b, p-channel FETs 51b to 54b, p-channel FETs 81a to 84a, p-channel FETs 91a to 94a.

Here, the inverters 31 to 34, p-channel FETs 21a, 21b to 24a, 24b, p-channel FETs 81a, 81b to 84a, 84b constitute a control circuit.

Figure 7:
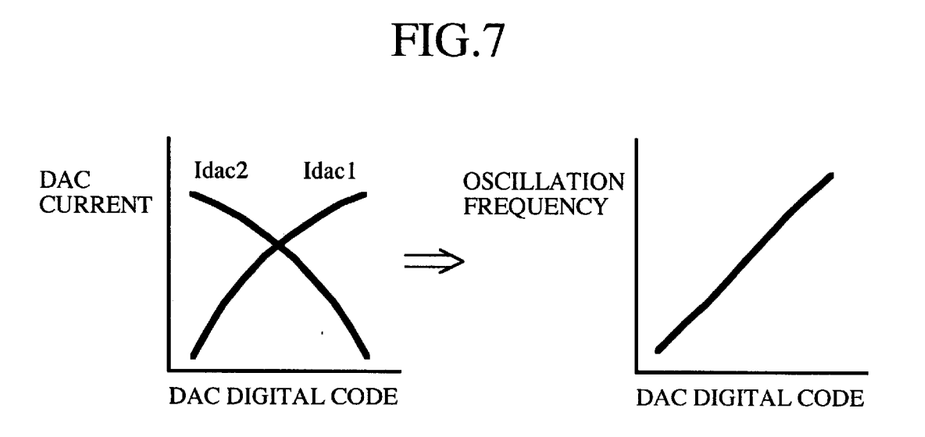
FIG. 7 are characteristic charts to illustrate the relation between digital codes and analog currents Idac 1, Idac 2 of the DAC circuit according to Embodiment 2 of the invention, and the relation between the digital codes and the oscillation frequency of the ring oscillator using the DAC circuit of the same.

FIG. 7 is a characteristic chart to illustrate the relation between the digital codes and the analog currents Idac 1, Idac 2 of the DAC circuit according to Embodiment 2, and the relation between the digital codes and the oscillation frequency of the ring oscillator using the DAC circuit of the same.

Next, the operation will be explained.

In the DAC circuit 1 illustrated in FIG. 6, the transistor number of the current mirror sources, the p-channel FETs 11, 21 to 24, which are connected to the constant current source 12, is Scale=50, Scale=8, 4, 2, 1, respectively, a current of 50 µA in total flowing through them constantly.

Also, through the current mirror sources p-channel FETs 71, 81 to 84, which are connected to the constant current source 72, a current of 50 µA in total flow constantly.

Now, if the value of bit 0 is "0", the p-channel FET 24a turns ON and the p-channel 24b turns OFF, accordingly the p-channel FET 24 turns OFF, and also the p-channel FET 84a turns OFF and the p-channel 84b turns ON, accordingly the p-channel FET 24 turns ON. Conversely, if the value of bit 0 is "1", the p-channel FET 24a turns OFF and the p-channel 24b turns ON, accordingly the p-channel FET 24 turns ON, and also the p-channel FET 84a turns ON and the p-channel 84b turns OFF, accordingly the p-channel FET 24 turns OFF. Bit 1 to bit 3 are just alike.

As a result, in the p-channel FETs 21 to 24, the number of the transistors that turn ON increases as the value of the digital codes increases from the minimum (0000) to the maximum (1111); and in the p-channel FETs 81 to 84, reversely, the number of the transistors that turn OFF increases as the value of the digital codes increases.

In this manner, the p-channel FET 11 and FETs 21 to 24 are controlled such that the total current 50 µA flow constantly through them, and the number of the transistors that turn ON increases as the digital code increases, and in reverse to this, the p-channel FET 71 and FETs 81 to 84 are controlled such that the total current 50 µA flow constantly through them, and the number of the transistors that turn OFF increases as the digital code increases.

Therefore, in the p-channel FETs 51 to 54 connected in the current mirror configuration with the p-channel FET 11, FETs 21 to 24, the analog current Idac 1 flows in such a manner as to increase over a linear variation, around the medium value of the digital code. Also, in the p-channel FETs 91 to 94 connected in the current mirror configuration with the p-channel FET 71, FETs 81 to 84, the analog current Idac 2 flows in such a manner as to increase over the linear variation, around the medium value of the digital code.

Further, the operations of the p-channel FETs 51 to 54 and p-channel FETs 91 to 94 are controlled, in the same manner as those of the p-channel FETs 21 to 24 and p-channel FETs 81 to 84, by operating the p-channel FETs, 51a, 51b to 54a, 54b and the p-channel FETs 91a, 91b to 94a, 94b in accordance with the values of bit3 to bit0.

The left characteristic chart in FIG. 7 illustrates the relation between the digital codes and the analog currents Idac 1, Idac 2 of the DAC circuit 1 illustrated in FIG. 6, and the right characteristic chart in FIG. 7 illustrates the relation between the digital codes input to the DAC circuit 1 and the oscillation frequency output from the composite circuit 3, when the ring oscillator is controlled using the analog currents Idac 1, Idac 2 according to the digital codes.

According to Embodiment 2 as described above, since the analog currents Idac 1, Idac 2 output from the DAC circuit 1 flow in such a manner as to increase over the linear variation, around the medium value of the digital code, supplying the analog currents Idac 1, Idac 2 from this DAC circuit 1 to the ring oscillator will make the variations in the finally obtained oscillation frequency relative to the digital codes linear.

Embodiment 3

Figure 8:
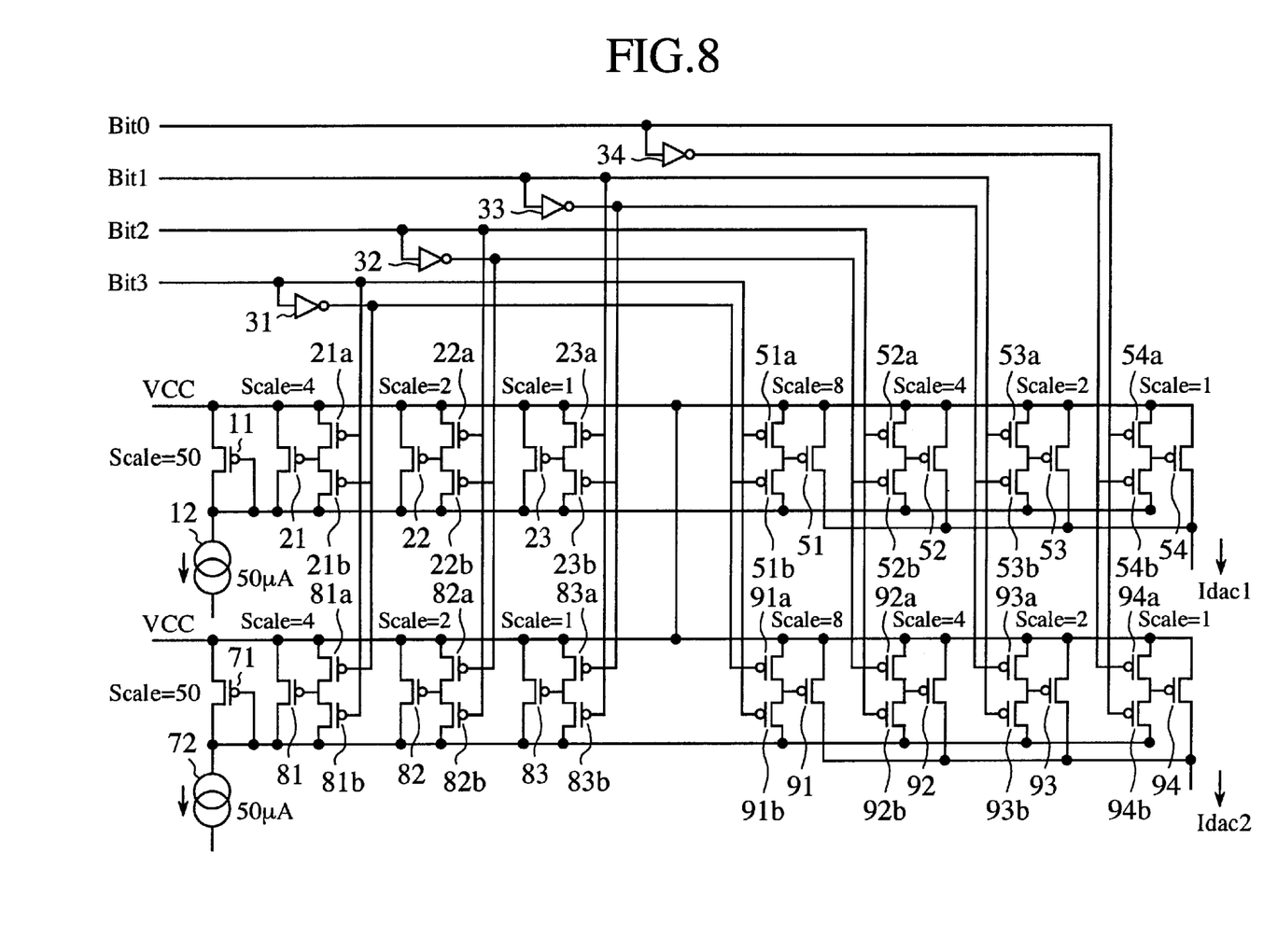
FIG. 8 is a circuit diagram to illustrate a DAC circuit according to Embodiment 3 of the invention.

FIG. 8 illustrates a circuit diagram to illustrate a DAC circuit according to Embodiment 3, and the difference from the circuit illustrated in FIG. 6 lies in that the p-channel FETs 24, 24a, 24b, and the p-channel FETs 84, 84a, 84b are deleted in FIG. 8, and the transistor number of the p-channel FETs 21, 22, 23 and p-channel FETs 81, 82, 83 is produced in Scale=4, 2, 1.

FIG. 9 is a characteristic chart to illustrate the relation between the digital codes and the analog currents Idac 1, Idac 2 of the DAC circuit according to Embodiment 2, and the relation between the digital codes and the analog currents Idac 1, Idac 2 of the DAC circuit according to Embodiment 3.

Next, the operation will be explained.

In Embodiment 2, the DAC circuit is provided with the p-channel FETs of the first transistor group and the second transistor group in correspondence with all the bits of the digital codes. However, the control of these p-channel FETs is only the control of the analog current by 1 LSB of the digital codes; and if the conditions do not require such high accuracy, it is not necessary to control the p-channel FETs by the lower bits of the digital codes. In such a case, it is possible to control the operation of the corresponding p-channel FETs of the first and second transistor groups only by the side of the upper bits of the digital codes, as shown in FIG. 8.

Figure 9A:
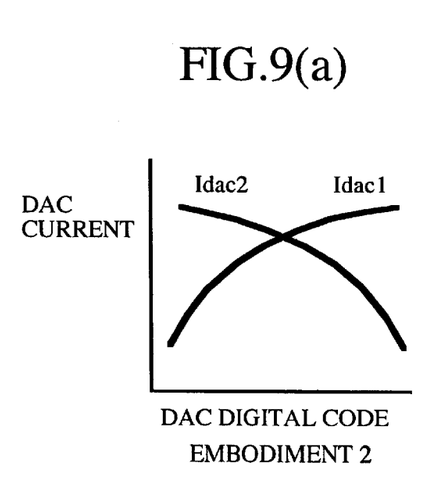
FIGS. 9A–B are characteristic charts to illustrate the relation between the digital codes and the analog currents Idac 1, Idac 2 of the DAC circuit according to Embodiment 2 of the invention, and the relation between digital codes and analog currents Idac 1, Idac 2 of the DAC circuit according to Embodiment 3 of the invention.

FIG. 9(a) illustrates the relation between the digital codes and the analog currents Idac 1, Idac 2 of the DAC circuit according to Embodiment 2, in which the p-channel FETs of the first transistor group and the second transistor group are furnished in correspondence with all the bits of the digital codes. Thus, the analog currents Idac 1, Idac 2 are controlled even on the side of the lower bits, and the high accuracy characteristics is attained.

Figure 9B:
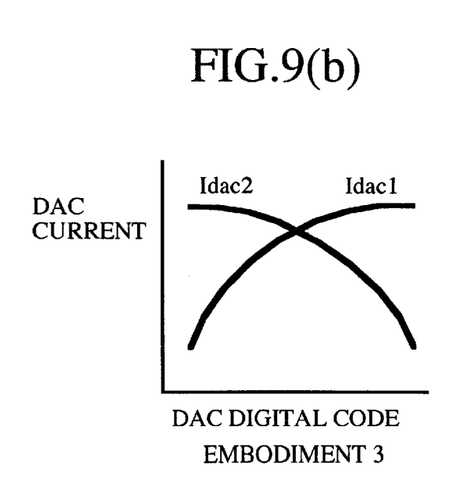

FIG. 9(b) illustrates the relation between the digital codes and the analog currents Idac 1, Idac 2 of the DAC circuit according to Embodiment 3, in which the p-channel FETs of the LSB side are deleted from the p-channel FETs of the first and second transistor groups. Accordingly, the analog currents are not controlled on the side of the LSB, and a characteristic curve having seven corners is attained.

Thus, according to Embodiment 3, it is possible to delete the p-channel FETs corresponding to the lower bits of the first and second transistor groups, whereby the layout size as well as the chip size can be reduced.

Further, the deletion of the p-channel FETs corresponding to the lower bits leads to decreasing the transistor number on the side of the upper bits one after another. Thereby, the layout size as well as the chip size can further be reduced.

In the above description, Embodiment 3 is applied to Embodiment 2, however it may be applied to Embodiment 1, and a similar effect can be achieved by deleting the transistors corresponding to the lower bits of the first transistor group.

Embodiment 4

Figure 10A:
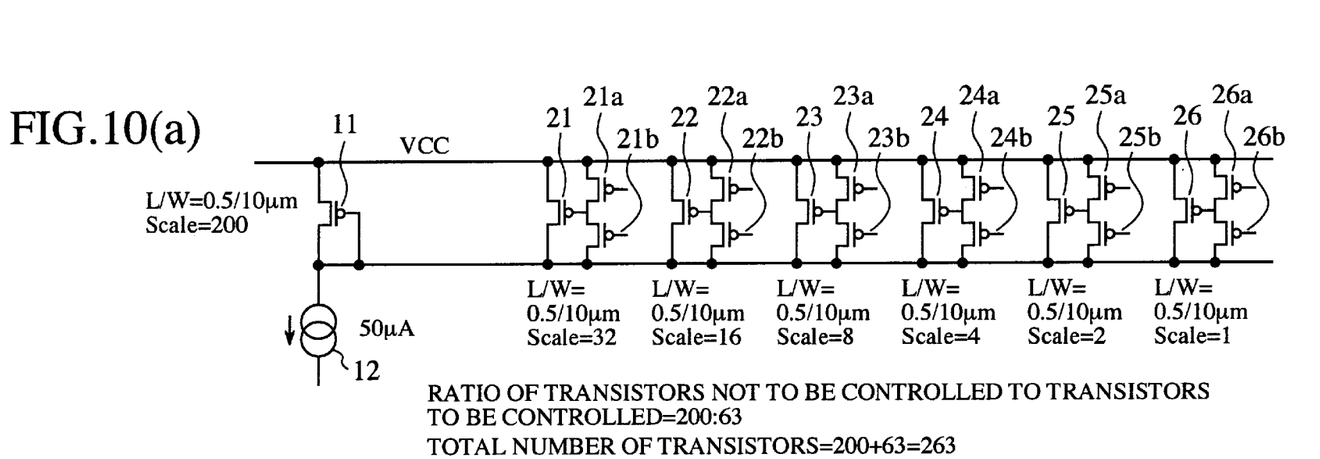
FIGS. 10A–B are circuit diagrams to illustrate a first transistor group of a DAC circuit according to Embodiment 4 of the invention.
Figure 10B:
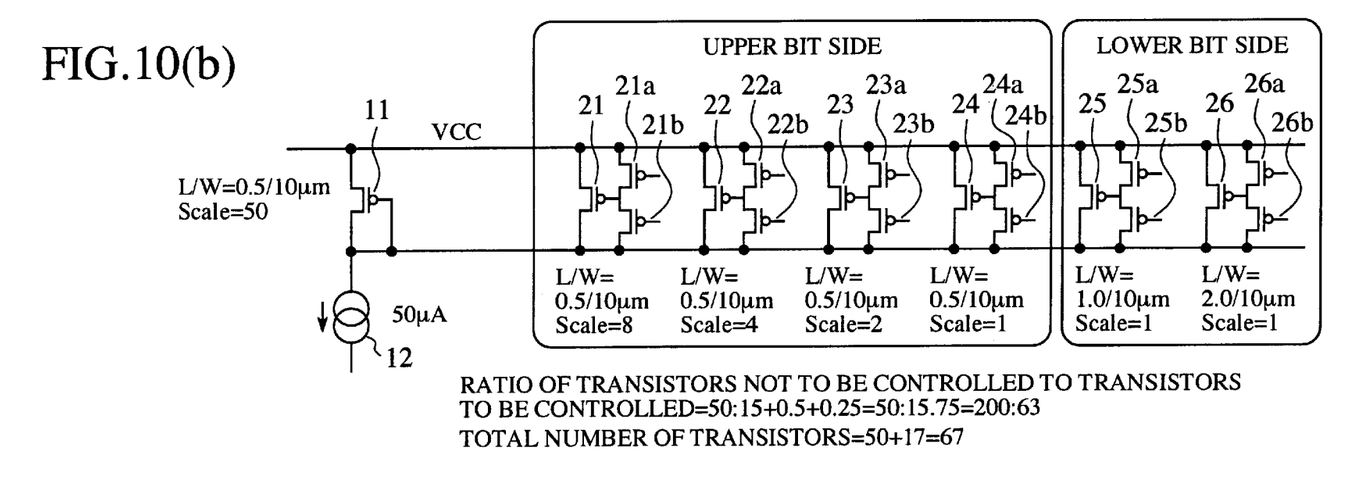

FIG. 10 includes circuit diagrams of the first transistor group of a DAC circuit according to Embodiment 4, in which FIG. 10(a) illustrates the first transistor group that is produced according to the normal transistor number in a case where the digital codes are composed of 6 bits, and FIG. 10(b) illustrates the first transistor group that is produced according to the features of Embodiment 4 in a case where the digital codes are also composed of 6 bits.

In the figure, reference numerals 21 to 26 each denote a p-channel FET. The p-channel FETs 21 to 26 are provided in correspondence with bit 5 to bit 0, respectively. Reference numerals 21a, 21b to 26a, 26b each denote a p-channel FET. The p-channel FETs 21a, 21b to 26a, 26b are provided in correspondence with the p-channel FETs 21 to 26, respectively. Each pair of the p-channel FETs 21a, 21b to 26a, 26b are connected to each other in series.

Next, the operation will be explained.

As shown in FIG. 10(a), in the first transistor group that is produced according to the normal transistor number, the p-channel FETs 11, 21 to 26 are produced on the conditions of L/W (gate length/gate width)=0.5/10 μm in common, and Scale (transistor number)=200, 32, 16, 8, 4, 2, 1.

Now, the first transistor group includes the p-channel FETs that are controlled by the digital codes, and the p-channel FETs that are not controlled by the digital codes. Depending on the ratio of the transistor number of the p-channel FETs that are controlled to the transistor number of the p-channel FETs that are not controlled, the curvatures of the analog currents Idac 1, Idac 2 vary. Thus, the linearity of the oscillation frequency can be achieved by adjusting the curvatures. Now, the p-channel FETs that are controlled by the digital codes only vary the curvatures of the analog currents Idac 1, Idac 2, and they are not required to have so high accuracy. Accordingly, it is also possible to increase the gate length L of the p-channel FETs on the lower bits for a smaller layout size.

In FIG. 10(a), the ratio of the transistor number of the p-channel FET 11 being not controlled to that of the p-channel FETs 21 to 26 being controlled is 200:63, and the total sum of the transistor number is 263.

On the other hand, in the first transistor group produced by the transistor number according to the features of Embodiment 4, as shown in FIG. 10(b), the p-channel FETs 11, 21 to 24 are designed on L/W=0.5/10 μm in common, the p-channel FET 25 on L/W=1.0/10 μm, and the p-channel FET 26 on L/W=2.0/10 μm. Thus, as the gate length becomes longer, the current becomes more difficult to flow; as the result, it becomes possible to produce the p-channel FETs 11, 21 to 26 in Scale (transistor number)=50, 8, 4, 2, 1, 1, 1.

In FIG. 10(b), the ratio of the transistor number of the p-channel FET 11 being not controlled to that of the p-channel FETs 21 to 26 being controlled is 200:63, which is the same as the case with FIG. 10(a). However, the total sum of the transistor number is 67, which is substantially reduced compared to 263 in FIG. 10(a).

Here, although the description has been made with the first transistor group, the second transistor group may be produced in the same manner.

Thus, according to Embodiment 4, it is possible to increase the gate length of the p-channel FETs corresponding to the lower bits of the first and second transistor groups, whereby the transistor number can be decreased, and the layout size as well as the chip size can be reduced.

In the above description, the configuration of Embodiment 4 is applied to Embodiment 2, however it may be applied to Embodiment 1, and a similar effect can also be achieved by increasing the gate length of the p-channel FETs corresponding to the lower bits of the first transistor group.

Embodiment 5

Figure 11A:
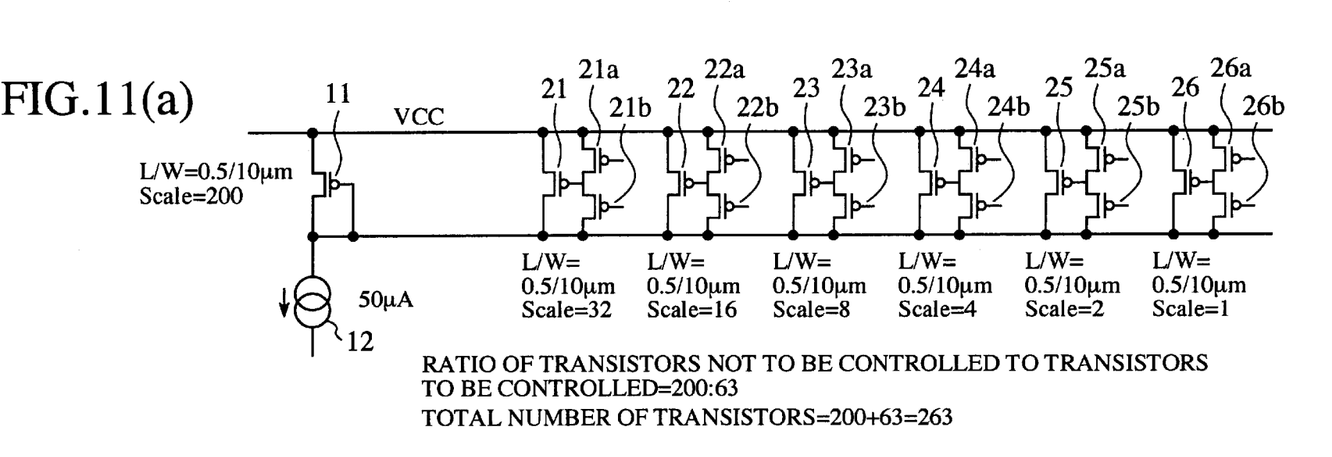
FIGS. 11A–B are circuit diagrams to illustrate a first transistor group of a DAC circuit according to Embodiment 5 of the invention.
Figure 11B:
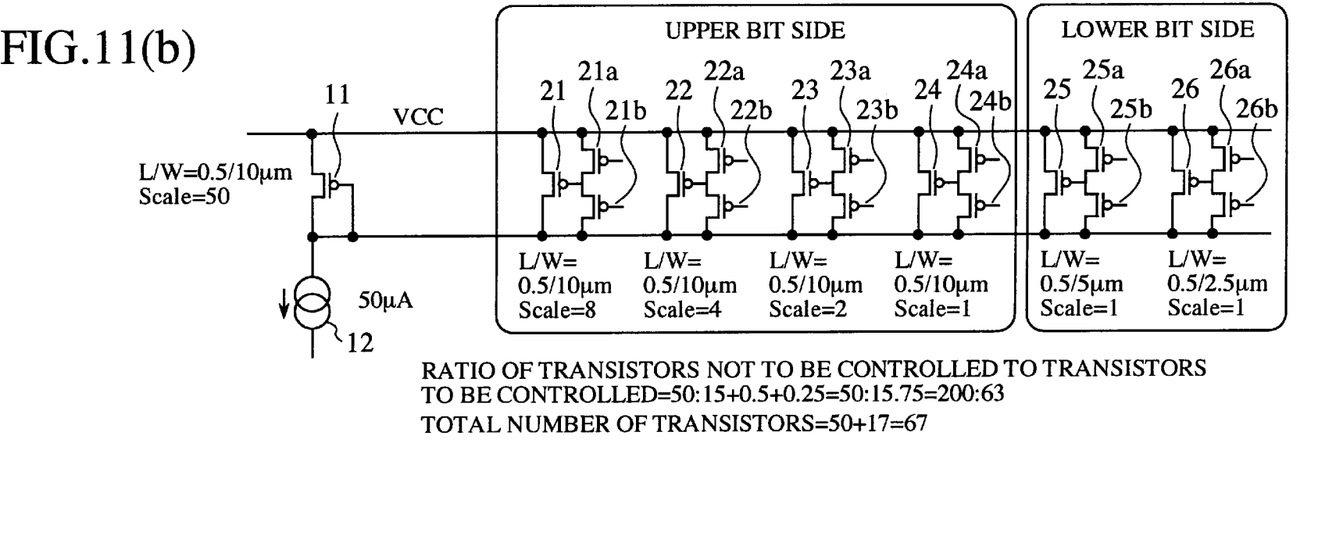

FIG. 11 includes circuit diagrams of a first transistor group of a DAC circuit according to Embodiment 5, FIG. 11(a) illustrates the first transistor group that is produced according to the normal transistor number in a case where the digital codes are composed of 6 bits, and FIG. 11(b) illustrates the first transistor group that is produced according to the features of Embodiment 5 in a case where the digital codes are also composed of 6 bits.

Next, the operation will be explained.

In this embodiment 5, a gate width W of p-channel FETs on the side of lower bits is decreased for a smaller layout size.

As shown in FIG. 11(b), in the first transistor group produced by the transistor number according to the features of Embodiment 5, p-channel FETs 11, 21 to 24 are designed on L (gate length)/W (gate width)=0.5/10 μm in common, a p-channel FET 25 on L/W=0.5/5 μm, and a p-channel FET 26 on L/W=0.5/2.5 μm. Thus, as the gate width becomes narrower, the current becomes more difficult to flow; as a result, it becomes possible to produce the p-channel FETs 11, 21 to 26 in Scale (transistor number)=50, 8, 4, 2, 1, 1, 1.

In FIG. 11(b), the ratio of the transistor number of the p-channel FET 11 being not controlled to the transistor number of the p-channel FETs 21 to 26 being controlled is 200:63, which is the same as the case with FIG. 11(a). However, the total sum of the transistor number is 67, which is a sharp cut compared to 263 in FIG. 11(a).

Here, although the description has been made of the first transistor group, a second transistor group is produced in the same manner.

Thus, according to Embodiment 5, it is possible to decrease the gate width of the p-channel FETs corresponding to the lower bits of the first and second transistor groups, whereby the transistor number can be decreased, and the layout size as well as the chip size can be reduced.

In the above description, the configuration of Embodiment 5 is applied to Embodiment 2, however it may be applied to Embodiment 1, and a similar effect can also be achieved by decreasing the gate width of the p-channel FETs corresponding to the lower bits of the first transistor group.

What is claimed is:

1. A digital-to-analog converting circuit comprising:

a first transistor group composed of a plurality of transistors, which causes a constant current to flow through said plurality of transistors;

a second transistor group composed of a plurality of transistors corresponding to each bit of digital codes, and composing a current mirror circuit together with said first transistor group; and a control circuit that perform a control by which a number of transistors to be turned ON in said first transistor group is decreased around a medium value of the digital codes input, and the number of transistors to be turned ON in said first transistor group is increased around the minimum value and the maximum value of the digital codes, and said second transistor group outputs analog currents according to the digital codes into two split routes.

2. A digital-to-analog converting circuit as claimed in claim 1, wherein said first transistor group is composed of a plurality of transistors corresponding to only a plurality of upper bits except for the most significant bit of the digital codes, and said control circuit controls the operation of the plurality of transistors in said first transistor group on the basis of the most significant bit of the input digital codes and the plurality of upper bits.

3. A digital-to-analog converting circuit as claimed in claim 1, wherein said first transistor group is composed of a plurality of transistors corresponding to each bit except for the most significant bit of the digital codes, and a gate length of the transistors corresponding to the lower bits of the digital codes is made longer as compared with a gate length of the transistors corresponding to the upper bits of the digital codes.

4. A digital-to-analog converting circuit as claimed in claim 1, wherein said first transistor group is composed of a plurality of transistors corresponding to each bit except for the most significant bit of the digital codes, and a gate width of the transistors corresponding to the lower bits of the digital codes is made narrower as compared with a gate width of the transistors corresponding to the upper bits of the digital codes.

5. A digital-to-analog converting circuit comprising:

a first transistor group composed of a plurality of transistors, which causes a constant current to flow through said plurality of transistors;

a second transistor group composed of a plurality of transistors, which causes a constant current to flow through said plurality of transistors;

a third transistor group composed of a plurality of transistors corresponding to each bit of digital codes, and composing a current mirror circuit together with said first transistor group, in which the transistors corresponding to each bit of the input digital codes operate in accordance with the input digital codes so as to output an analog current in accordance with the digital codes;

a fourth transistor group composed of a plurality of transistors corresponding to each bit of digital codes, and composing a current mirror circuit together with said second transistor group, in which the transistors corresponding to each bit of the input digital codes operate in accordance with the input digital codes in a manner reverse to said third transistor group to output an analog current in accordance with the digital codes; and a control circuit that performs control by which the number of transistors to be turned ON in said first transistor group is increased and to increase the number of transistors to be turned OFF in said second transistor group is increased, while the input digital codes are increased from the minimum value to the maximum value.

6. A digital-to-analog converting circuit as claimed in claim 5, wherein said first transistor group and said second transistor group are respectively composed of a plurality of transistors corresponding to only a plurality of upper bits of the digital codes, and said control circuit controls the operation of the plurality of transistors in said first and second transistor groups on the basis of the plurality of upper bits of the input digital codes.

7. A digital-to-analog converting circuit as claimed in claim 5, wherein said first transistor group and said second transistor group are respectively composed of a plurality of transistors corresponding to each bit of the digital codes, and a gate length of the transistors corresponding to the lower bits of the digital codes is made longer as compared with a gate length of the transistors corresponding to the upper bits of the digital codes.

8. A digital-to-analog converting circuit as claimed in claim 5, wherein said first transistor group and said second transistor group are respectively composed of a plurality of transistors corresponding to each bit of the digital codes, and a gate width of the transistors corresponding to the lower bits of the digital codes is made narrower as compared with a gate width of the transistors corresponding to the upper bits of the digital codes.

* * * * *